(12) United States Patent
Chen et al.

(10) Patent No.: US 9,257,641 B2
(45) Date of Patent: Feb. 9, 2016

(54) VIA STRUCTURE, MEMORY ARRAY STRUCTURE, THREE-DIMENSIONAL RESISTANCE MEMORY AND METHOD OF FORMING THE SAME

(71) Applicant: Industrial Technology Research Institute, Hsinchu (TW)

(72) Inventors: Frederick T. Chen, Hsinchu County (TW); Tai-Yuan Wu, Taipei (TW); Yu-Sheng Chen, Taoyuan County (TW); Wei-Su Chen, Hsinchu (TW); Pei-Yi Gu, Hsinchu County (TW); Yu-De Lin, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/488,300

(22) Filed: Sep. 17, 2014

(65) Prior Publication Data

US 2015/0129827 A1    May 14, 2015

Related U.S. Application Data

(60) Provisional application No. 61/901,441, filed on Nov. 8, 2013.

(51) Int. Cl.
*H01L 45/00* (2006.01)
*H01L 27/24* (2006.01)

(52) U.S. Cl.
CPC .......... *H01L 45/122* (2013.01); *H01L 27/2481* (2013.01); *H01L 45/04* (2013.01); *H01L 45/06* (2013.01); *H01L 45/08* (2013.01); *H01L 45/1226* (2013.01); *H01L 45/1253* (2013.01); *H01L 45/145* (2013.01);

(Continued)

(58) Field of Classification Search
CPC ....... H01L 45/04; H01L 45/06; H01L 45/122; H01L 45/145; H01L 45/146; H01L 45/1683; H01L 45/1691; H01L 23/52; H01L 23/522; H01L 23/5226; H01L 23/528; H01L 23/5283
See application file for complete search history.

(56) References Cited

U.S. PATENT DOCUMENTS

| 7,205,186 B2 | 4/2007 | Wang et al. |
| 7,652,336 B2 | 1/2010 | Han et al. |
| 7,820,513 B2 | 10/2010 | Hareland et al. |

(Continued)

FOREIGN PATENT DOCUMENTS

| CN | 101226951 | 6/2010 |
| TW | 200725613 | 7/2007 |

OTHER PUBLICATIONS

Hong Sik Yoon, et al., "Vertical Cross-point Resistance Change Memory for Ultra-High Density Non-volatile Memory Applications," VLSI Technology, 2009 Symposium on, Jun. 16-18, 2009, pp. 26-pp. 27.
H.Kim, et al., "Plasma-enhanced atomic layer deposition of tantalum thin films: the growth and film properties," Thin Solid Films vol. 441, May 20, 2003, pp. 311-pp. 316.

(Continued)

*Primary Examiner* — Eduardo A Rodela
(74) *Attorney, Agent, or Firm* — Jianq Chyun IP Office

(57) ABSTRACT

Provided is a three-dimensional resistance memory including a stack of layers. The stack of layers is encapsulated in a dielectric layer and is adjacent to at least one opening in the encapsulating dielectric layer. At least one L-shaped variable resistance spacer is disposed on at least a portion of the sidewall of the opening adjacent to the stack of layers. An electrode layer fills the remaining portion of the opening.

37 Claims, 11 Drawing Sheets

(52) U.S. Cl.
CPC ......... *H01L 45/146* (2013.01); *H01L 45/1616* (2013.01); *H01L 45/1683* (2013.01); *H01L 45/1691* (2013.01)

(56) References Cited

U.S. PATENT DOCUMENTS

| | | | |
|---|---|---|---|
| 8,324,736 B2 * | 12/2012 | Kawashita et al. | 257/775 |
| 8,389,358 B2 | 3/2013 | Shih et al. | |
| 8,421,139 B2 | 4/2013 | Kanakasabapathy et al. | |
| 8,624,218 B2 | 1/2014 | Chen | |
| 2006/0197130 A1 * | 9/2006 | Suh et al. | 257/296 |
| 2008/0283815 A1 * | 11/2008 | Nejad | 257/4 |
| 2009/0149012 A1 | 6/2009 | Brask et al. | |
| 2010/0216279 A1 | 8/2010 | Lai et al. | |
| 2013/0221308 A1 * | 8/2013 | Toh | H01L 45/04 257/2 |
| 2014/0264234 A1 * | 9/2014 | Tu et al. | 257/4 |

OTHER PUBLICATIONS

Yi-Hsuan Hsiao, et al., "A Critical Examination of 3D Stackable NAND Flash Memory Architectures by Simulation Study of the Scaling Capability," Memory Workshop (IMW), 2010 IEEE International, May 16-19, 2010, pp. 1-pp. 4.

Ryota Katsumata, et al., "Pipe-shaped BiCS Flash Memory with 16 Stacked Layers and Multi-Level-Cell Operation for Ultra High Density Storage Devices," VLSI Technology, 2009 Symposium on, Jun. 16-18, 2009, pp. 136-pp. 137.

Seong-Geon Park, et al., "A Non-Linear ReRAM Cell with sub-1µA Ultralow Operating Current for High Density Vertical Resistive Memory (VRRAM)," Electron Devices Meeting (IEDM), 2012 IEEE International, Dec. 10-13, 2012, pp. 20.8.1-pp. 20.8.4.

Henry (Hong-Yu) Chen, et al., "3D Vertical RRAM," Flash Memory Summit 2013, pp. 1-pp. 27.

* cited by examiner

VIA STRUCTURE, MEMORY ARRAY STRUCTURE, THREE-DIMENSIONAL RESISTANCE MEMORY AND METHOD OF FORMING THE SAME

CROSS-REFERENCE TO RELATED APPLICATION

This application claims the priority benefits of U.S. provisional application Ser. No. 61/901,441, filed on Nov. 8, 2013. The entirety of the above-mentioned patent application is hereby incorporated by reference herein and made a part of this specification.

TECHNICAL FIELD

The disclosure relates to a via structure, a memory array structure, a three-dimensional resistance memory and a method of forming the same.

BACKGROUND

Memory devices developed based on semiconductor techniques, such as dynamic random access memory (DRAM), static random access memory (SRAM), and non-volatile memory, have played a major part in today's semiconductor industry. These memories have been broadly applied to personal computers, mobile phones, and networks and have become one of the most indispensable electronic products in our daily life.

The demand for memories having low power consumption, low cost, high access speed, small volume, and high capacity has been increasing drastically along with the widespread of consumable electronic products and system products. Recording data by changing the resistance of a variable resistance layer is a promising alternative to storing charge or magnetization.

Resistive random access memory (RRAM) has recently gained tremendous popularity due to its high endurance switching while consuming lower voltage than Flash (<5V). RRAM also has the ability to scale further than NAND flash at lower cost, due to its relatively simple structure, and decoupling from front-end process. However, NAND technology has been moving to a bit-cost-scalable (BICS) methodology, which allows a 3D multilayer structure to be built with minimal cost. In order for RRAM to complete with this form of NAND flash on cost, it also must be able to be built in a similar fashion. Since RRAM will not require the extra chip area for charge pumping for the typically high (about 10~20 V) voltages required for NAND flash programming, a BICS-style RRAM will ultimately prevail for high-density memory.

SUMMARY

One of exemplary embodiments comprises a three-dimensional resistance memory including a stack of layers, at least one L-shaped variable resistance spacer and a first electrode layer. "Variable resistance" is understood to refer to a material capable of taking on different resistance states, due to internal migration of, for example, oxygen vacancies or metal cations. Besides resistance change, the spacer material may be capable of charge trapping or storing ferroelectric polarization. The stack of layers containing at least one conductive layer and at least one insulation layer is disposed on a substrate, encapsulated in a dielectric layer and is adjacent to at least one opening in the dielectric layer. The at least one L-shaped variable resistance spacer is disposed on at least a portion of the sidewall of the opening adjacent to the stack of layers. The first electrode layer fills the remaining portion of the opening.

One of exemplary embodiments comprises a method of forming a three-dimensional resistance memory, which includes providing a stack of layers encapsulated in a dielectric layer and adjacent to at least one opening in the dielectric layer, forming at least one L-shaped variable resistance spacer on at least a portion of the sidewall of the opening adjacent to the stack of layers, and filling the remaining portion of the opening with a first electrode layer.

One of the exemplary embodiments comprises a via structure, which is formed adjacent to a stack comprising at least one horizontal metal layer and at least one insulation layer, and includes at least one L-shaped oxide spacer covering a sidewall of an opening, a non L-shaped metallic spacer covering the L-shaped oxide spacer, and a conductive layer filling the remaining volume of the opening.

One of the exemplary embodiments comprises a memory array structure having the said via structure, wherein there are at least two horizontal metal lines contacting the via structure at its sidewall, and the horizontal metal lines are in the same plane.

One of the exemplary embodiments comprises a memory array structure having the said via structure, wherein there are at least two horizontal metal lines contacting the via structure at its sidewall, and the horizontal metal lines are stacked vertically and separated by one dielectric material.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
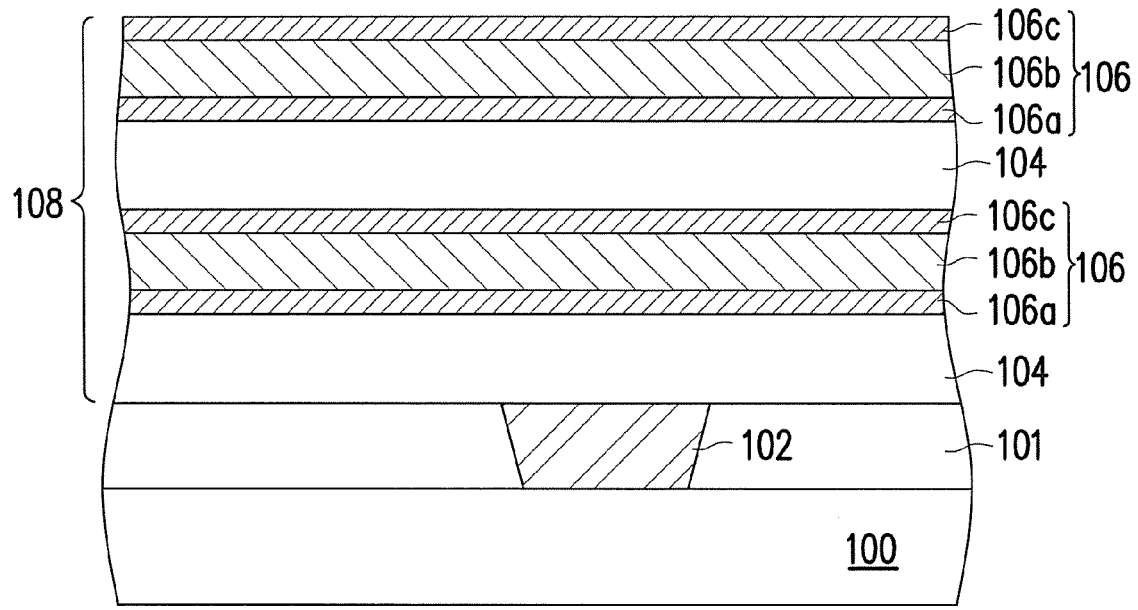
FIG. 1A to FIG. 1G are schematic cross-sectional views illustrating a method of forming a three-dimensional resistance memory according to an exemplary embodiment.

Reference will now be made in detail to the embodiments of the disclosure, examples of which are illustrated in the accompanying drawings. Wherever possible, the same reference numbers are used in the drawings and the description to refer to the same or like parts.

FIG. 1A to FIG. 1G are schematic cross-sectional views illustrating a method of forming a three-dimensional resistance memory according to an exemplary embodiment.

Referring to FIG. 1A, a stack of layers 108 is provided on a substrate 100. The substrate 100 can be a semiconductor substrate, such as a silicon-containing substrate. The substrate 100 has a gate structure (not shown) thereon and two doped regions (not shown) therein beside the gate structure. The substrate 100 further has a material layer 101 covering the gate structure. The material layer 101 can be a dielectric layer having a conductive plug 102 therein. In an embodiment, the conductive plug 102 can be electrically connected to one of the doped regions. The material layer 101 includes $SiO_2$, $SiO_x$, $AlO_x$, SiN or SiON, wherein x is greater than zero. The conductive plug 102 includes a metal, such as W.

In an embodiment, the stack of layers 108 includes at least one insulation layer 104 and at least one electrode layer (or called bit line layer, conductive layer or horizontal metal line) 106 arranged alternately. The insulation layers 104 include $SiO_2$, $SiO_x$, $AlO_x$, SiN or SiON, wherein x is greater than zero. The electrode layers 106 include W, TiN, Al, Ta, Cu, Ti or a combination thereof. In an embodiment, each electrode layer 106 is a sandwich structure including a bottom barrier layer 106a, a top barrier layer 106c and a metal layer 106b between the bottom barrier layer 106a and the top barrier layer 106c. In an embodiment, the bottom barrier layer 106a and the top barrier 106c include the same material, such as TiN. In another embodiment, the bottom barrier layer 106a and the top barrier layer 106c can include different materials. The metal layer 106b includes W, Al, Ta, Cu, Ti or a combination thereof. Each of the insulation layers 104 and the electrode layers 106 can be formed with at least one deposition process (e.g. CVD, PVD or ALD).

Figure 1B:
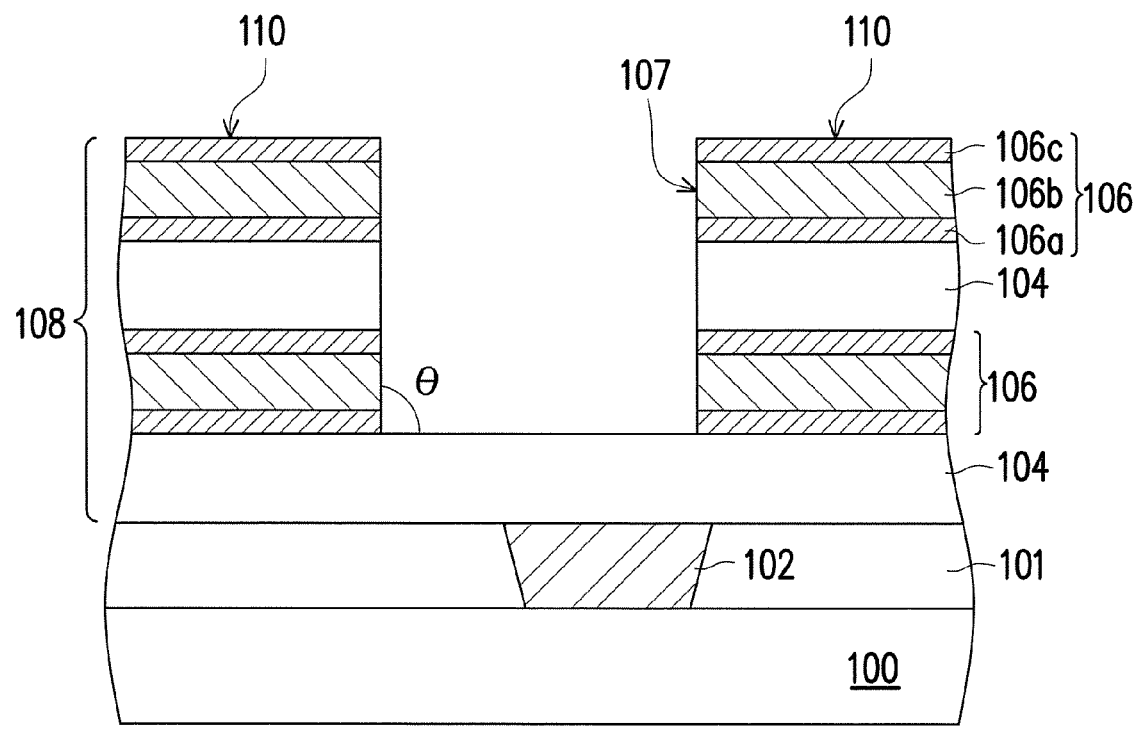

Referring to FIG. 1B, the insulation layers 104 and the electrode layers 106 are patterned to form at least two stacked structures 110 having an opening 107 in an encapsulating dielectric layer therebetween. In an embodiment, the opening 107 is wider than conductive plug 102, and the opening 107 has a central line different from that of the conductive plug 102. In another embodiment, the opening 107 has a width substantially equal to that of the conductive plug 102. The patterning step includes performing photolithography and etching processes. In an embodiment, the lowest insulation layer 104 is not etched by the patterning step, as shown in FIG. 1B. In another embodiment (not shown), the opening 107 can be formed through all of the electrode layers 106 and the insulation layers 104.

The embodiment of FIG. 1B in which the included angle θ between the material layer 101 and one sidewall of the opening 107 is about 90 degrees is provided for illustration purposes, and is not construed as limiting the disclosure. In another embodiment, the included angle θ can be more than 90 degrees. The included angle θ between the material layer 101 and one sidewall of the opening 107 is required to be equal to or more than about 90 degrees and equal to or less than about 110 degrees, otherwise the spacer(s) (e.g. spacers 114a, 116a, and 118a in FIG. 1F) cannot be Ruined on the sidewall of the opening 107.

Figure 1C:
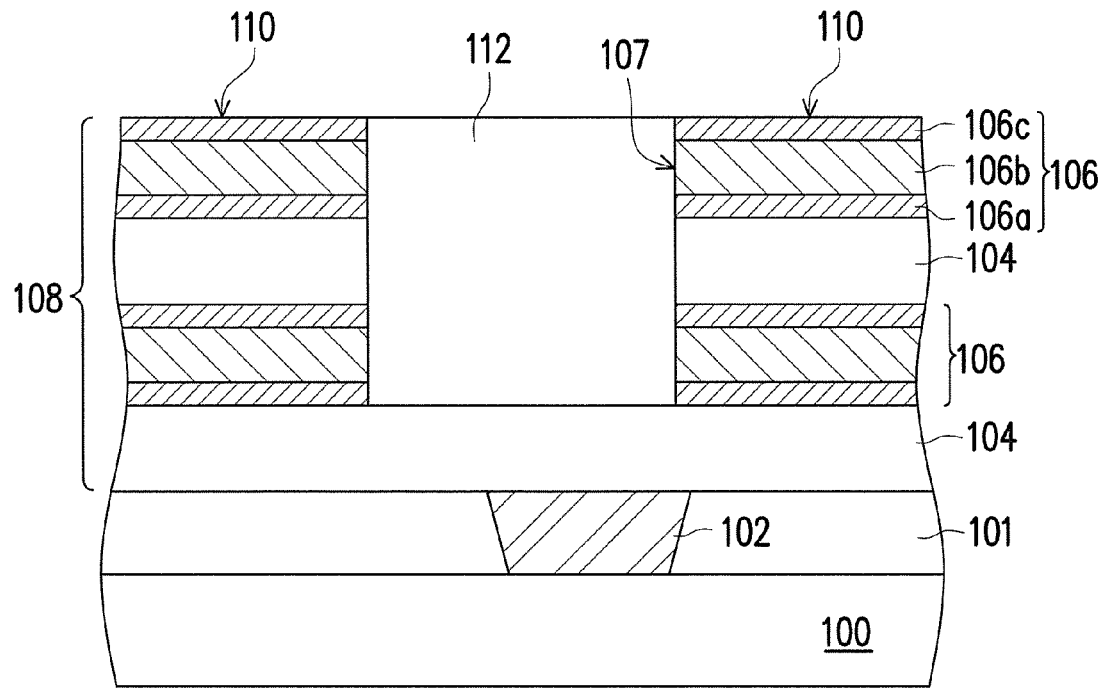

Referring to FIG. 1C, a dielectric layer 112 is formed in the opening 107. The method of foil ling the dielectric layer 112 includes depositing an isolation material layer (not shown) on the substrate 100 filling the opening 107. The isolation material layer includes $SiO_2$, $SiO_x$, $AlO_x$, SiN or SiON, and the forming method thereof includes performing a deposition process (e.g. CVD). Thereafter, a planarization process (e.g. CMP) is performed to remove a portion of the isolation material layer outside the opening 107.

Figure 1D:
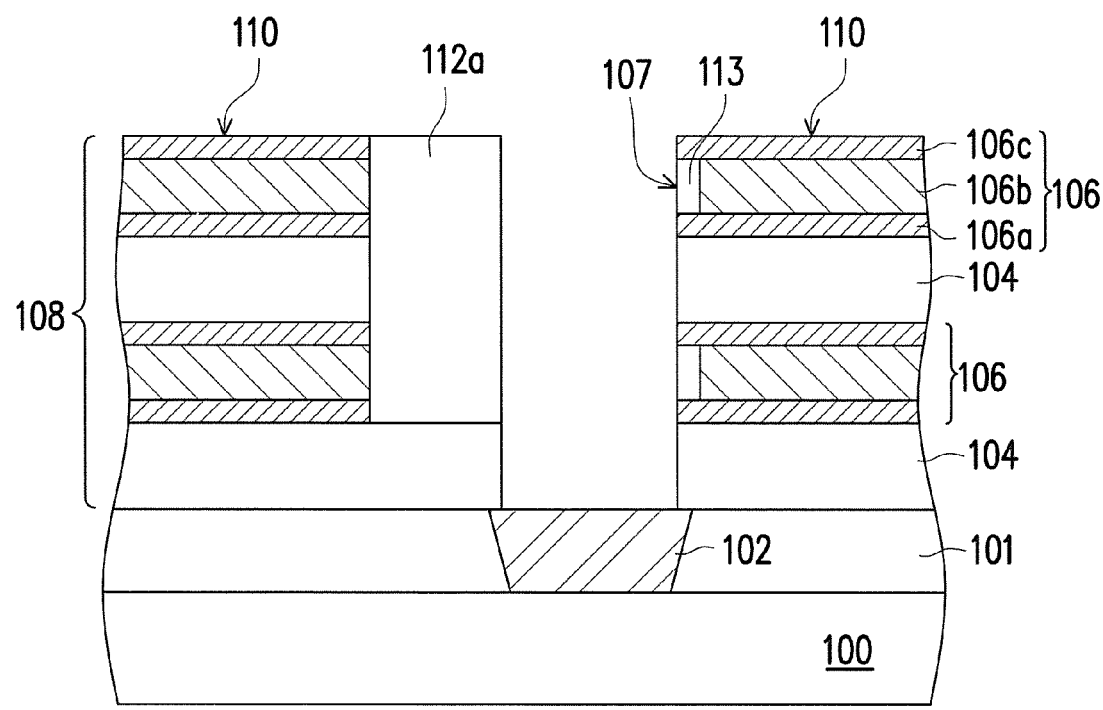

Referring to FIG. 1D, a portion of the dielectric layer 112 is removed, so that the remaining dielectric layer 112a is formed on one sidewall (e.g. left sidewall) of the opening 107. Upon the step in FIG. 1D, one sidewall (e.g. left sidewall) of the opening 107 is covered by the dielectric layer 112a, while another sidewall (e.g. right sidewall) of the opening 107 is exposed. The removing step includes performing photolithography and etching processes. This removing step can simultaneously remove a portion of the lowest insulation layer 104 and therefore expose the conductive plug 102.

Thereafter, an optional oxidation process is performed to the metal layer 106b, so as to form a metal oxide layer 113 on a portion of the exposed sidewall of the opening 107. The metal oxide layer 113 is formed from the exposed portion of the metal layer 106b through a thermal oxidation process. In an embodiment, the metal oxide layer 113 includes $AlO_x$, $TaO_x$ or $TiO_x$, wherein x is greater than zero. The metal oxide layer 113 can prevent the metal layer 106b from reacting with the subsequently formed variable resistance layer(s).

In this embodiment, the metal oxide layer is formed by a thermal oxidation process, but the disclosure is not limited thereto. In another embodiment (not shown), a metal oxide layer can be formed with a deposition process (e.g. CVD, PVD or ALD), so that the entire exposed sidewall of the opening is covered by the metal oxide layer.

Figure 1E:
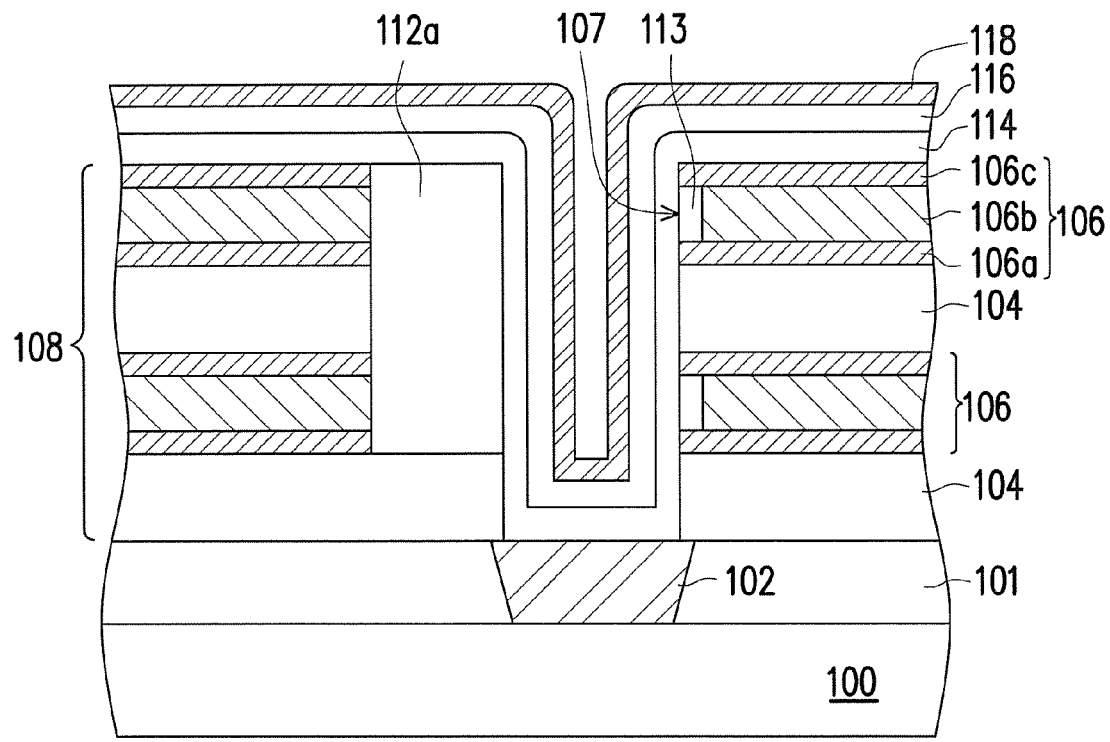

Referring to FIG. 1E, a first variable resistance layer 114, a second variable resistance layer 116 and a protection layer 118 are formed on the substrate 100 filling the opening 107. The top of the conductive plug 102 and the sidewall of the opening 107 are covered by the first variable resistance layer 114, the second variable resistance layer 116 and the protection layer 118. Each of the first variable resistance layer 114 and the second variable resistance layer 116 includes $HfO_x$, $TaO_x$, $AlO_x$, $TiO_x$, $NbO_x$, $LaO_x$, $ZrO_x$, doped versions thereof, or a combination thereof, wherein x is greater than zero. In an embodiment, each of the first variable resistance layer 114 and the second variable resistance layer 116 can be formed with a deposition process (e.g. CVD, PVD or ALD). In another embodiment, each of the first variable resistance layer 114 and the second variable resistance layer 116 can be formed with a metal ALD process and followed by an annealing process. The protection layer 118 includes Ta, Ti, TaN or TiN. In an embodiment, the protection layer 118 can be formed with a deposition process (e.g. CVD, PVD or ALD).

The protection layer 118 can protect the first variable resistance layer 114 and the second variable resistance layer 116 from being damaged in the following etching process.

Figure 1F:
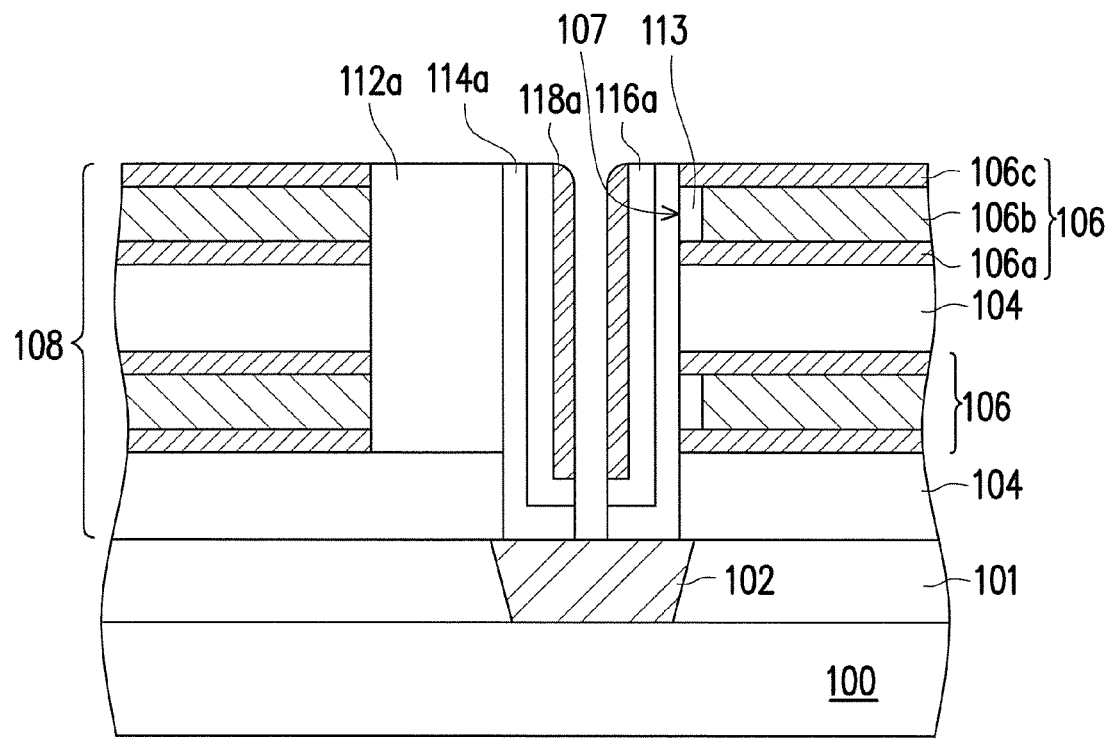

Referring to FIG. 1F, an anisotropic etching process is performed to the first variable resistance layer 114, the second variable resistance layer 116 and the protection layer 118, so as to form a first L-shaped variable resistance spacer 114a, a second L-shaped variable resistance spacer 116a and an I-shaped or non L-shaped protection spacer 118a on another sidewall (e.g. right sidewall) of the opening 107. In this embodiment, the metal oxide layer 113 is formed between the metal layer 106b and the first L-shaped variable resistance spacer 114a. A portion of the conductive plug 102 is exposed upon the anisotropic etching process.

Figure 1G:
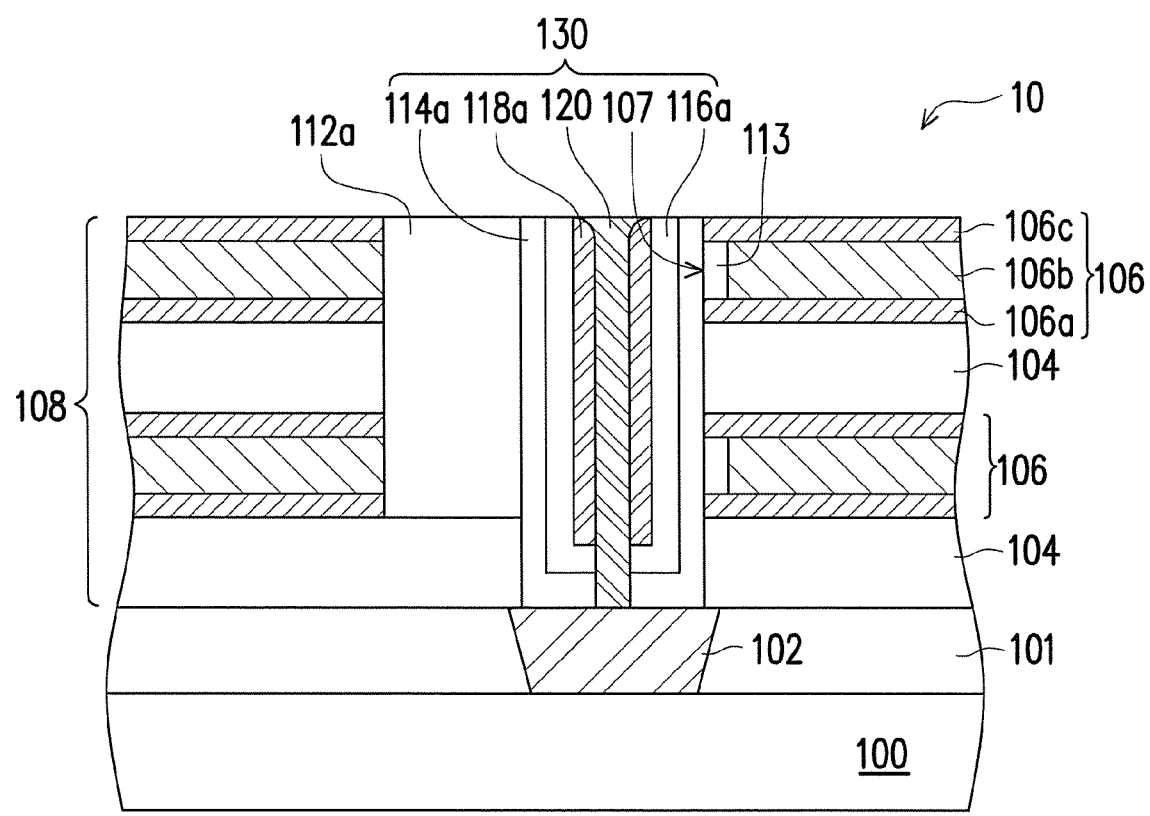

Referring to FIG. 1G, the remaining portion of the opening 107 is filled with an electrode layer 120. The electrode layer 120 fills up the opening 107 and is electrically connected to the conductive plug 102. The electrode layer 120 can include a material the same or different from that of the electrode layer 106. The method of forming the electrode layer 120 includes forming an electrode material layer (not shown) on the substrate 100 filling the opening 107. The electrode material layer includes W, TiN, Al, Ta, Cu, Ti or a combination thereof, and the forming method thereof includes performing a deposition process (e.g. CVD, PVD or ALD). Thereafter, a planarization process (e.g. CMP) is performed to remove a portion of the electrode material layer outside the opening 107. The three-dimensional resistance memory 10 is thus completed.

In view of the above, a stack of layers 108 containing at least one electrode layer 106 and at least one insulation layer 104 is formed on a material layer 101, encapsulated in a dielectric layer 112a and is adjacent to at least one opening 107 adjacent to the stack of layers 108 (as shown in FIG. 1A to FIG. 1D), two L-shaped variable resistance spacers 114a and 116a and one optional protection spacer 118a are formed on at least a portion of the sidewall of the opening (as shown in FIG. 1E), and the remaining portion of the opening 107 is filled with an electrode layer 120 (as shown in FIG. 1F).

The structure of the three-dimensional resistance memory of the disclosure is illustrated below with reference to FIG. 1G. As shown in FIG. 1G, the three-dimensional resistance memory 10 includes a stack of layers 108, a first L-shaped variable resistance spacer 114a, a second L-shaped variable resistance spacer 116a, an I-shaped protection spacer 118a and an electrode layer 120. The stack of layers 108 is disposed on a material layer 101 (possibly including $SiO_2$) and having at least one opening 107 therethrough. In an embodiment, the stack of layers 108 includes a plurality of insulation layers 104 (possibly including $SiO_2$) and a plurality of electrode layers 106 arranged alternately. In this embodiment, each electrode layer 106 is a sandwich structure including a bottom barrier layer 106a (possibly including TiN), a top barrier layer 106c (possibly including TiN) and a metal layer 106b (possibly including Al) between the bottom barrier layer 106a and the top barrier layer 106c. The first and second L-shaped variable resistance spacers 114a and 116a are disposed on one sidewall (e.g. right sidewall in FIG. 1G) of the opening 107. In one embodiment, the first L-shaped variable resistance spacer 114a can be a metal oxide layer (possibly including HfOx) with oxygen vacancies, and the second L-shaped variable resistance spacer 116a can be another metal oxide layer (possibly including TaOx) as an oxygen atom gettering layer. The electrode layer 120 fills the remaining portion of the opening 107. The I-shaped protection spacer 118a (possibly including Ta) is provided to protect the underlying variable resistance spacer(s). In this embodiment, the I-shaped protection spacer 118a is disposed between the second L-shaped variable resistance spacer 116a and the electrode layer 120 (possibly including TiN). The material layer 101 has a conductive plug 102 (possibly including W) therein, and the electrode layer 120 is electrically connected to the conductive plug 102.

In addition, the three-dimensional resistance memory 10 further includes a metal oxide 113 (possibly including AlOx) and a dielectric layer 112a (possibly including $SiO_2$). The metal oxide layer 113 is provided to prevent the metal layer 106b from reacting with the first L-shaped variable resistance spacer 114a. In one embodiment, the metal oxide layer 113 is disposed between the metal layer 106b and the first L-shaped variable resistance spacer 114a. The dielectric layer 112a is provided to reduce the cross-talk phenomenon between two adjacent cells. In one embodiment, the dielectric layer 112a is disposed in the opening 107, on another sidewall (e.g. left sidewall in FIG. 1G) of the opening 107 and in contact with the first L-shaped variable resistance spacer 114a.

The via structure of the disclosure can also be described below with reference to FIG. 1G. As shown in FIG. 1G, the via structure 130 is formed through at least one electrode layer (or called horizontal metal line) 106 and at least one insulation layer 104 and includes at least one L-shaped variable resistance spacer (or called L-shaped oxide spacer) 114a/116a covering the sidewall of an opening 107, an I-shaped protection spacer (or called non L-shaped metallic spacer) 118a covering the L-shaped oxide spacer 114a/116a, and an electrode layer (or called conductive layer) 120 filling the remaining volume of the opening 107. The via structure 130 lands on a conductive plug 102 (e.g. tungsten contact), and the conductive plug 102 is connected to a diffusion region of a transistor. In an embodiment, the at least one L-shaped variable resistance spacer includes a first L-shaped variable resistance spacer 114a disposed on the sidewall of the opening 107 and a second L-shaped variable resistance layer 116a disposed on the first L-shaped variable resistance spacer 114a. The first L-shaped variable resistance spacer 114a includes $HfO_2$ or $HfO_x$, and the second L-shaped variable resistance spacer 116a includes TaOx. The I-shaped protection spacer 118a includes Ta, Ti, TiN or TaN. The electrode layer 120 includes TiN.

The memory array structure of the disclosure has at least one via structure 130, wherein there are at least two electrode layers (or called horizontal metal lines) 106 contacting the via structure 130 at its sidewall, and the electrode layers 106 are in the same plane, or stacked vertically and separated by one insulation layer 104. In an embodiment, each of the electrode layers 106 includes Al, W, or TiN. In another embodiment, each of the electrode layers 106 includes laterally separated TiN and Cu.

Figure 2:
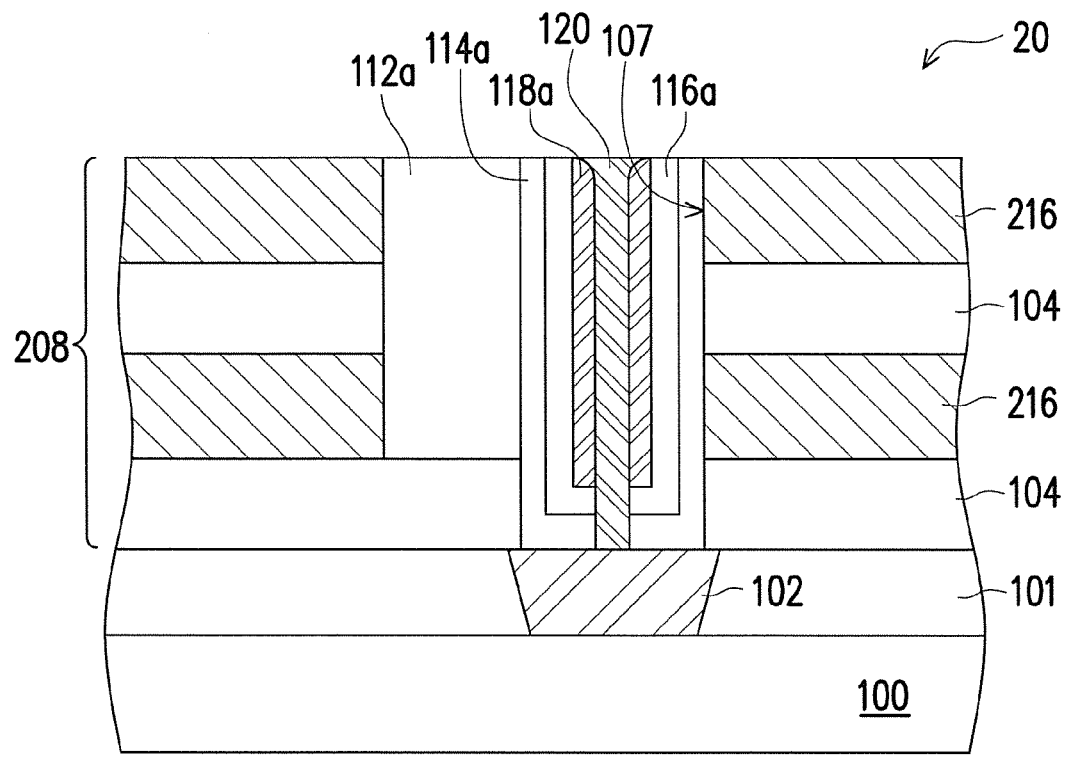
FIG. 2 is a schematic cross-sectional view illustrating a three-dimensional resistance memory according to another exemplary embodiment.

The embodiment of FIG. 1G in which each electrode layer 106 of the stack of layers 108 is a sandwich structure is provided for illustration, and is not construed as limiting the disclosure. In a second embodiment, each electrode layer 216 of the stack of layers 208 can be a single metal layer, as shown in the three-dimensional resistance memory 20 in FIG. 2. In such case, each electrode layer 216 includes W or TiN.

Figure 3:
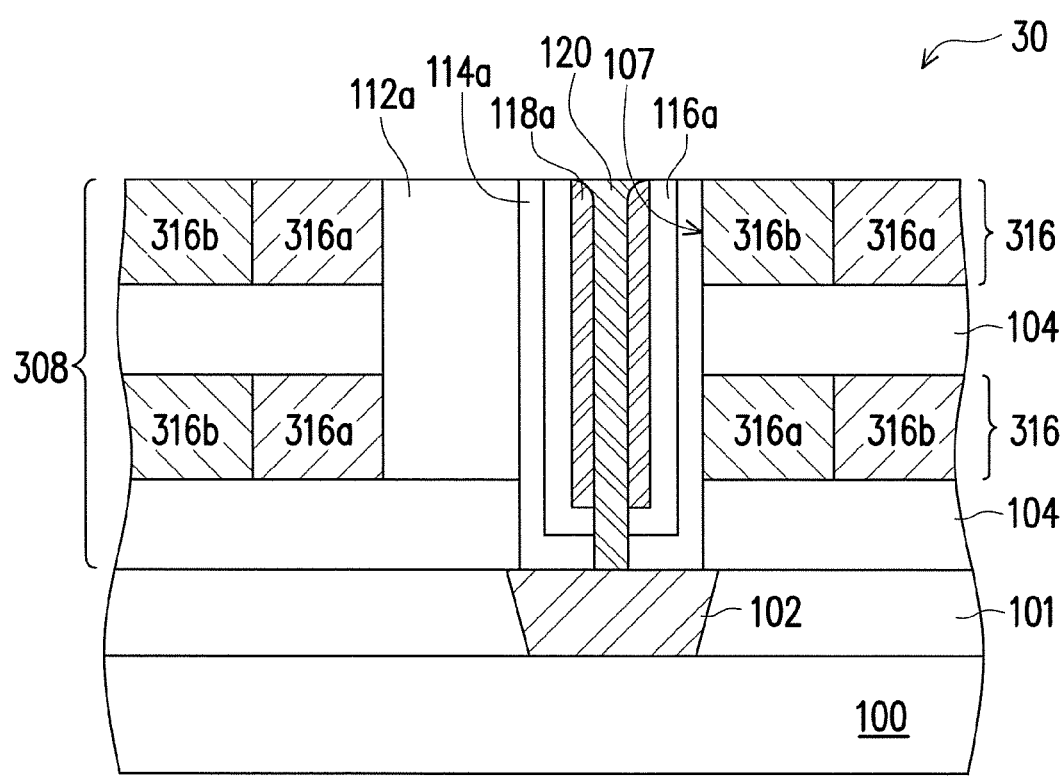
FIG. 3 is a schematic cross-sectional view illustrating a three-dimensional resistance memory according to yet another exemplary embodiment.

In a third embodiment, each electrode layer 316 of the stack of layers 308 can be a dual-metal layer including a first metal layer 316a and a second metal layer 316b, as shown in the three-dimensional resistance memory 30 in FIG. 3. The first metal layer 316a and the second metal layer 316a are disposed side by side, and the second metal layer 316b is disposed between the first L-shaped variable resistance spacer 114a and the first metal layer 316a. In such case, the first metal layer 316a includes Cu, and the second metal layer 316b includes TiN.

The method of forming the three-dimensional resistance memory 30 is described in the following. After the conductive layers 206 (e.g. horizontal TiN lines) of the second embodiment are patterned, at least one opening 107 is formed in the $SiO_2$ adjacent to the $TiN/SiO_2$ multilayer. A wet etchant is used to etch the TiN lines laterally to a certain extent, and therefore the remaining TiN lines form first metal layers 316a. The etchant may be a dilute HF solution, about 10% or less, and containing Pd or other TiN surface activator. Then, a copper electroless plating solution is used to plate Cu, filling most of the previously laterally etched space to form second metal layers 316b, but not depositing outside the space, since that would lead to bridging of Cu between the horizontal metal lines within the opening. The electroless plating solution may contain $CuSO_4$, ethylenediaminetetraacetic acid (EDTA), dimethylamineborane (DMAB) as well as water. The embodiment produces lower wire electrical resistance. However, the process complexity is greater. Hence, it would most likely be more appropriate when many (>2) layers of horizontal metal lines are used, so that simple connections to strap Cu lines become less cumbersome. The Cu lines and the spacer-containing openings can be encapsulated in a dielectric medium which blocks Cu diffusion, e.g., SiN, in order to prevent the occurrence of conducting bridge formation from the Cu lines between the stacks of layers.

In the embodiment of FIG. 1G, two L-shaped variable resistance spacers 114a and 116a and one I-shaped protection spacer 118a are disposed on one sidewall of the opening 107, but the disclosure is not limited thereto.

Figure 4:
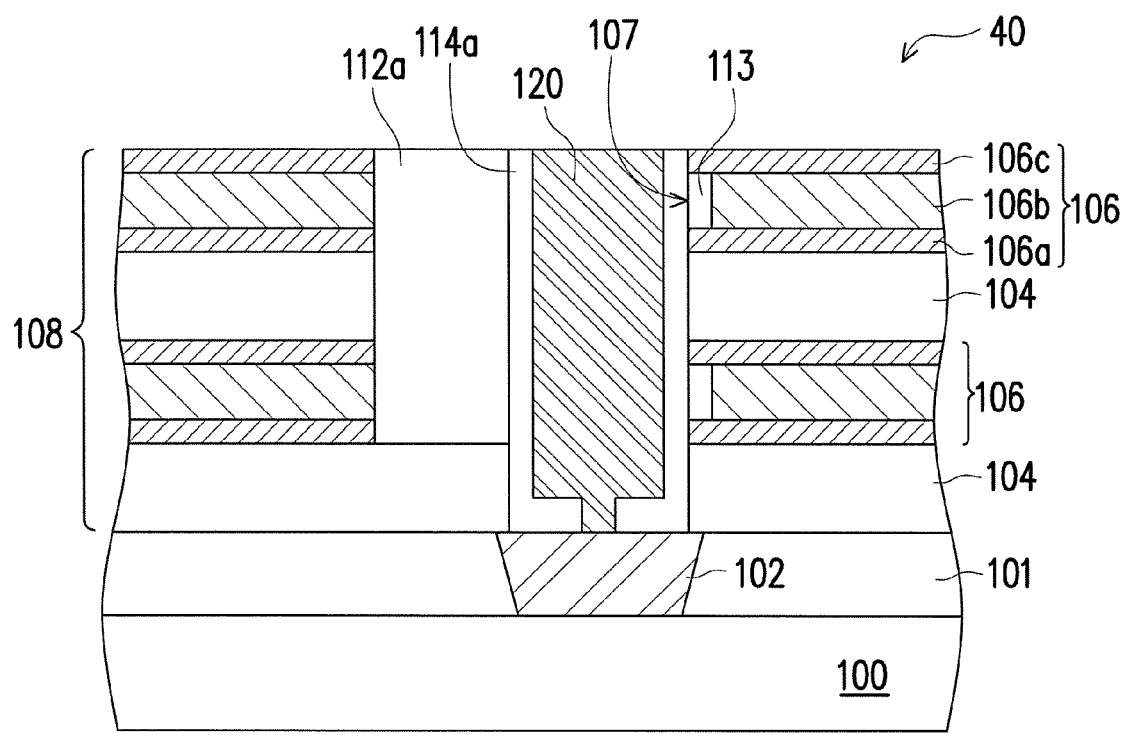
FIG. 4 is a schematic cross-sectional view illustrating a three-dimensional resistance memory according to still another exemplary embodiment.
Figure 5:
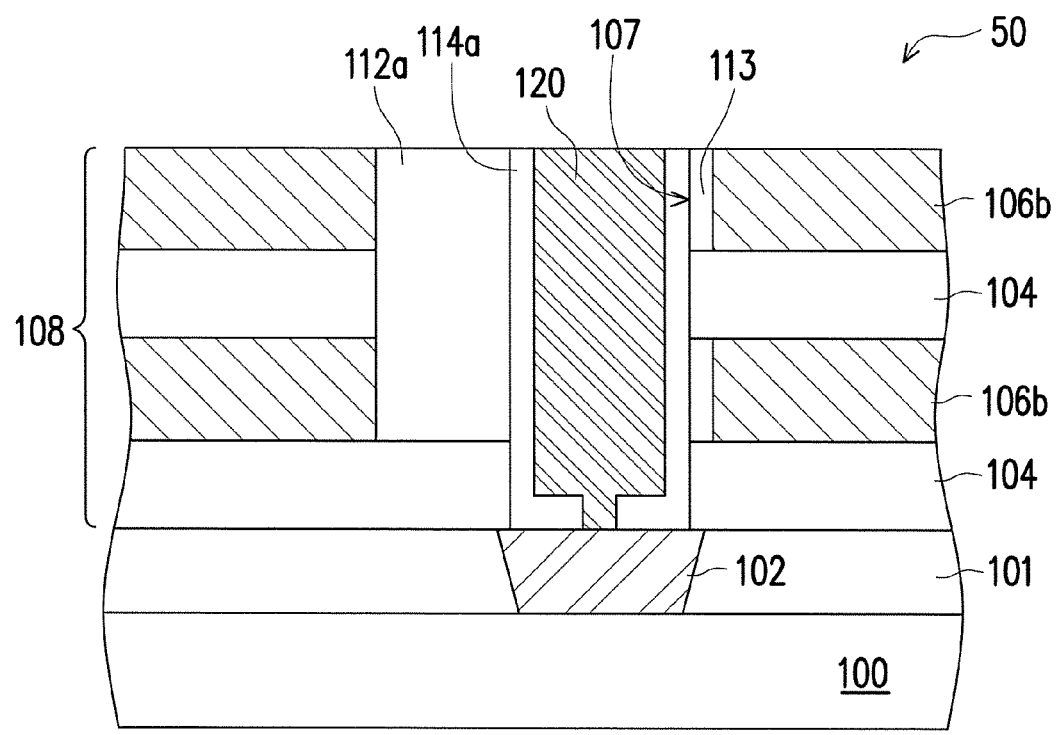
FIG. 5 is a schematic cross-sectional view illustrating a three-dimensional resistance memory according to another exemplary embodiment.

In another embodiment, only one L-shaped variable resistance spacer 114a is disposed on one sidewall of the opening 107, as shown in the three-dimensional resistance memory 40 in FIG. 4. In such case, each electrode layer 106 is a sandwich structure including a bottom barrier layer 106a (possibly including TiN), a top barrier layer 106c (possibly including TiN) and a metal layer 106b (possibly including Ta) between the bottom barrier layer 106a and the top barrier layer 106c. The single L-shaped variable resistance spacer 114a is possibly made by HfOx, the metal oxide layer 113 is possibly made by TaOx, and the electrode layer 120a is possibly made by TiN. In one embodiment, the L-shaped variable resistance spacer 114a can be a metal oxide layer (possibly including HfOx) with oxygen vacancies, and the metal oxide layer 113 can be another metal oxide layer (possibly including TaOx) as an oxygen atom gettering layer. The bottom barrier layer 106a and the top barrier layer 106c can be omitted from each electrode layer 106 of FIG. 4 upon the process requirements, so as to form the three-dimensional resistance memory 50 in FIG. 5.

Figure 6:
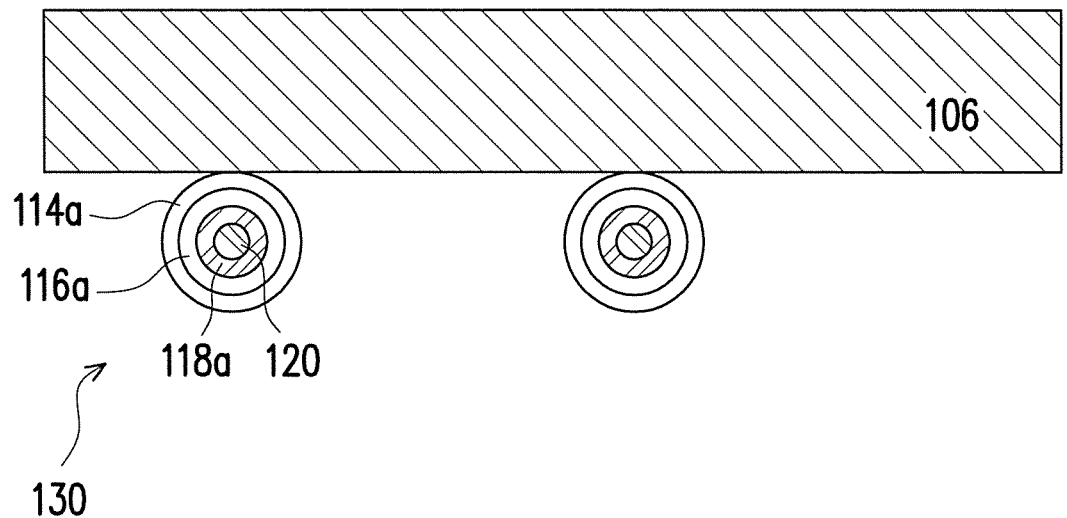
FIG. 6 is a schematic top view illustrating a three-dimensional resistance memory according to an exemplary embodiment.
Figure 7:
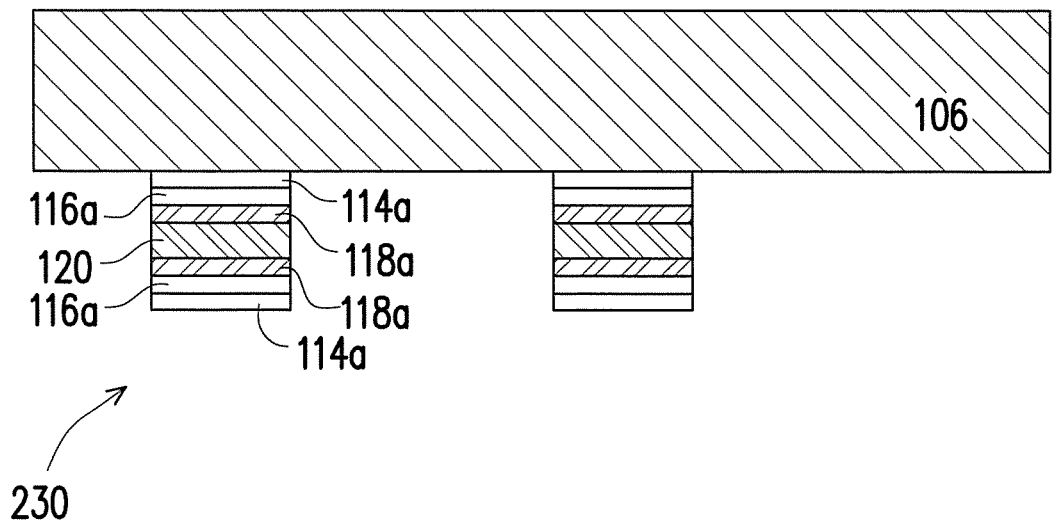
FIG. 7 is a schematic top view illustrating a three-dimensional resistance memory according to another exemplary embodiment.

In the embodiments, the opening 107 is formed first, and the L-shaped variable resistance spacers 114a and 116a, the I-shaped protection spacer 118a and the electrode layer 120 are then formed in the opening 107, so as to form via structures 130, as shown in the top view of FIG. 6. The disclosure is not limited thereto. In another embodiment, a trench is first patterned adjacent to (at least) one side of each multilayer. Thereafter, the variable resistance layers 114 and 116 and the protection layer 118 are deposited inside the trench and then etched to form the L-shaped variable resistance spacers 114a and 116a and the I-shaped protection spacer 118a. An electrode layer 120 fills the remaining volume of the trench. The spacers 114a, 116a and 118a and the electrode layer 120 are cut by another masked etch to form via structures 230, and the etched space filled with dielectric, e.g., $SiO_2$. This results in a different appearance from top view, as shown in FIG. 7.

In other words, in FIG. 6, each of the L-shaped variable resistance spacers 114a and 116a covers the entire sidewall of the opening of the corresponding via structure 130. In FIG. 7, each of the L-shaped variable resistance spacers 114a and 116a covers a portion of the sidewall of the opening of the corresponding via structure 230.

Figure 8:
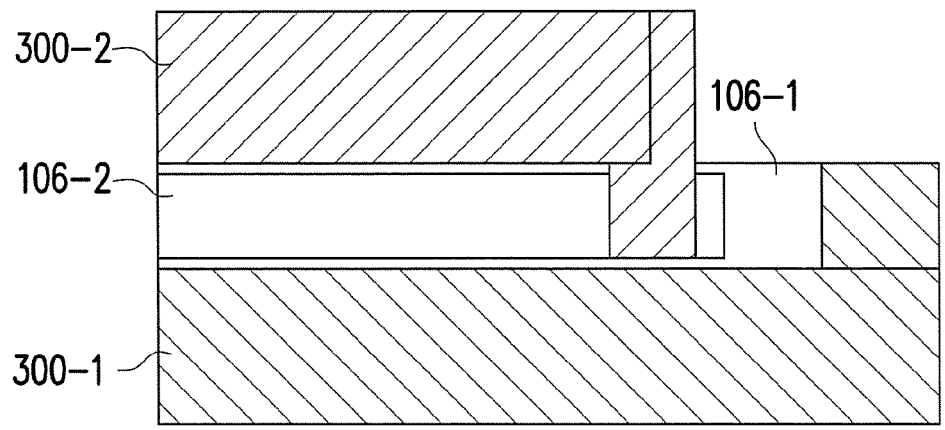
FIG. 8 is a schematic top view of strapping of two horizontal metal lines to copper lines located above the horizontal metal lines according to an exemplary embodiment.

As Cu is the least resistive metal, but cannot be directly etched, it can be patterned by deposition, such as the electroless plating process described above. When there are two layers, it could be easier to simply strap the two non-Cu (e.g., TiN) layers to different adjacent copper lines patterned above the array. As shown in the top view in FIG. 8, the two horizontal metal lines 106-1 and 106-2 are connected to Cu strap lines 300-1 and 300-2 above the upmost horizontal metal line 106-2 of the array. In one embodiment, the lower horizontal metal line 106-1 and the upper horizontal metal line 106-2 have a same width, the lower horizontal metal line 106-1 is connected to the lower Cu strap line 300-1, and the upper horizontal metal line 106-2 is connected to the upper Cu strap line 300-2. This process is expected to consume two masks to expose two different TiN line depths for the copper plugs to land on.

Alternatively, a single mask can be used when the width of the upper horizontal metal line 106-2 is narrower than the width of the lower horizontal metal line 106-1. First, the resist mask is used to define the horizontal metal lines 106-1 and 106-2 with the same width. Thereafter, the resist mask can be trimmed away to allow the lower metal line 106-1 to be exposed after etching away a portion of the upper horizontal metal line 106-2 and the underlying dielectric layer. This allows for the use of one mask rather than two to pattern two depths.

Figure 9:
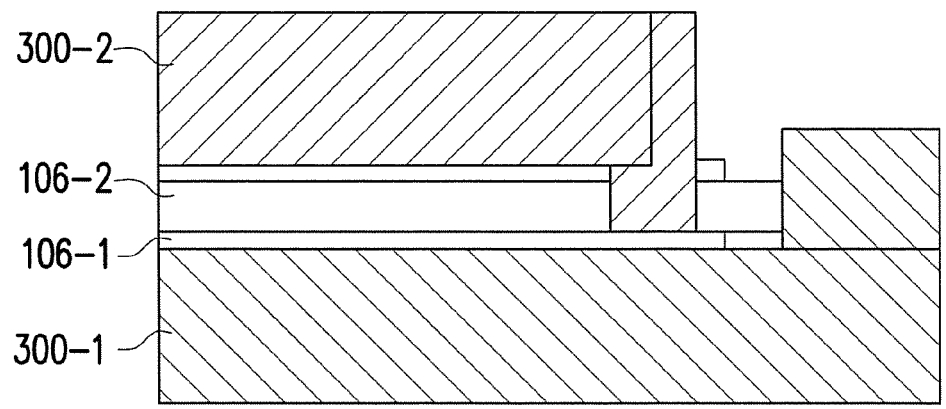
FIG. 9 is a schematic top view of strapping of two horizontal metal lines to copper lines located above the horizontal metal lines according to another exemplary embodiment.

Additionally, this technique may be extended to more than two layers, by adding landing areas and using additional Cu metal layers. For example, the Cu strap line for the third depth in a 3-layer arrangement can be positioned above or in between the two Cu strap lines in FIG. 9 or FIG. 10. For a 4-layer arrangement, a pair of Cu strap lines for the third and fourth depths can be positioned directly above the two Cu strap lines in FIG. 9. It may be extended to more than 4 layers.

Figure 10:
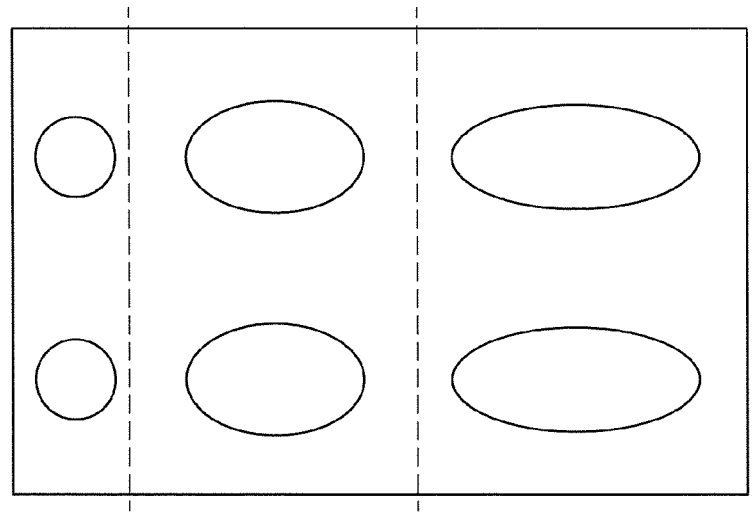
FIG. 10 is a schematic top view of landing areas for connecting plugs to different depths.

For many layers of lines connected to the 3D-RRAM via structures, etching connecting (metallic) plug openings of many depths to land at each layer can be performed. This could be accomplished by using plug opening lithography steps. To minimize the lithography processing, all the depths can be etched simultaneously, using single mask. This is achievable by widening plug opening which goes deeper, with the effect of micro-loading or aspect-ratio dependent etching. This would be easier by making the deeper plug landing areas for the deeper horizontal metal lines extend out further to allow the landing of wider plugs, as shown in FIG. 10, wherein the shallowest depth is shown on the left, and the largest depth on the right. An extended landing area allows fitting the extended plug area which allows the sufficiently deeper etch. Upper horizontal metal lines are connected to deeper metallic plugs, with each depth corresponding to laterally separated plug landing areas. A deeper plug landing area is more extended than a shallower plug landing area. That is, the landing area for a deeper metallic plug is more extended than the landing area for a shallower metallic plug.

In summary, the method of the disclosure removes any oxide from contacting the bottom of the opening, at least in one location, to allow direct metal contact to the underlying W conductive plug on the transistor diffusion region. The method of the disclosure is simple and can be compatible with the existing memory processes.

In addition, the structure of the disclosure allows the fabrication of the L-shaped RRAM (HfOx) layer and the L-shaped current-limiting (TaOx) layer without damaging them in the spacer formation process. This is crucial to forming the TaOx/HfOx selector-less RRAM which is able to limit the SET current on its own without the use of an adjacent transistor. The structure is also nonlinear in its high resistance state (HRS), limiting sneak currents in the array during the SET operation.

Figure 11:
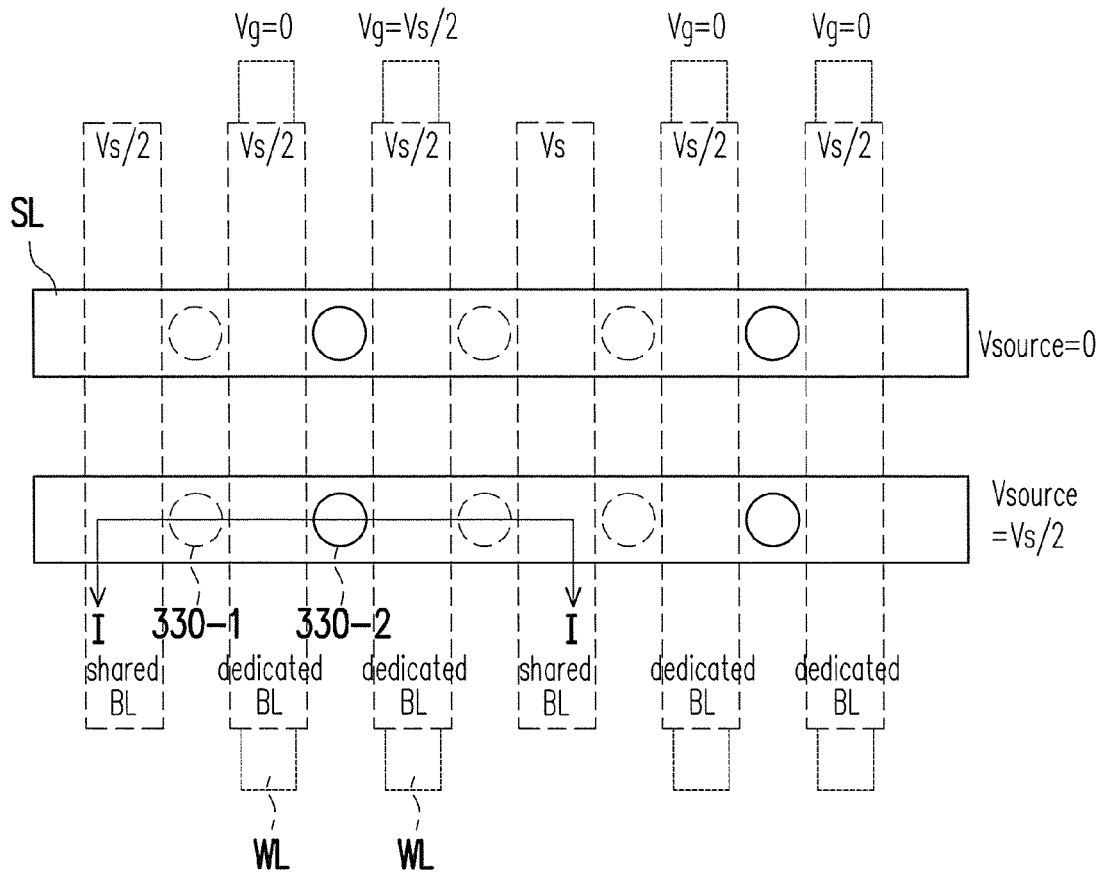
FIG. 11 is a schematic top view illustrating a three-dimensional resistance memory according to an exemplary embodiment.
Figure 12:
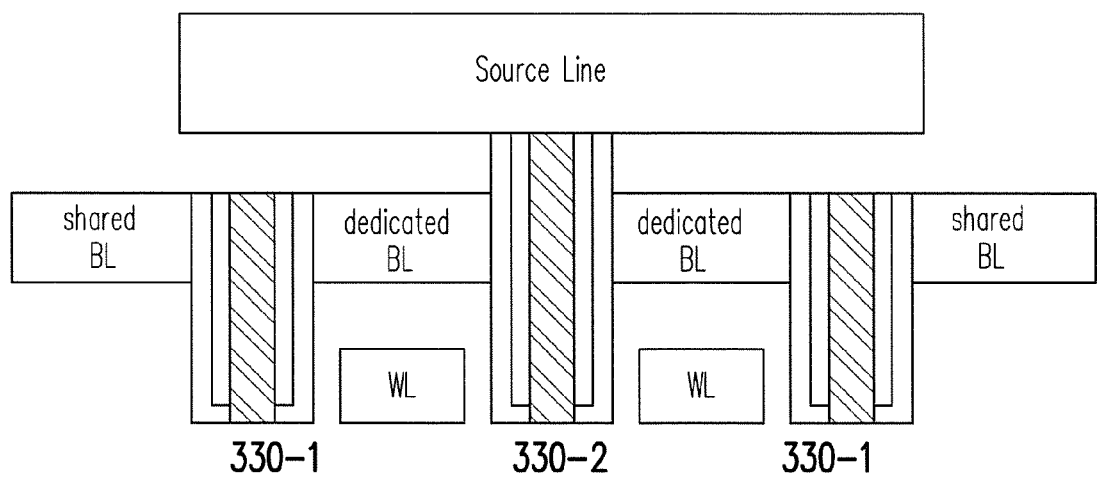
FIG. 12 is a schematic cross-sectional view taken along I-I line of FIG. 11.
Figure 13:
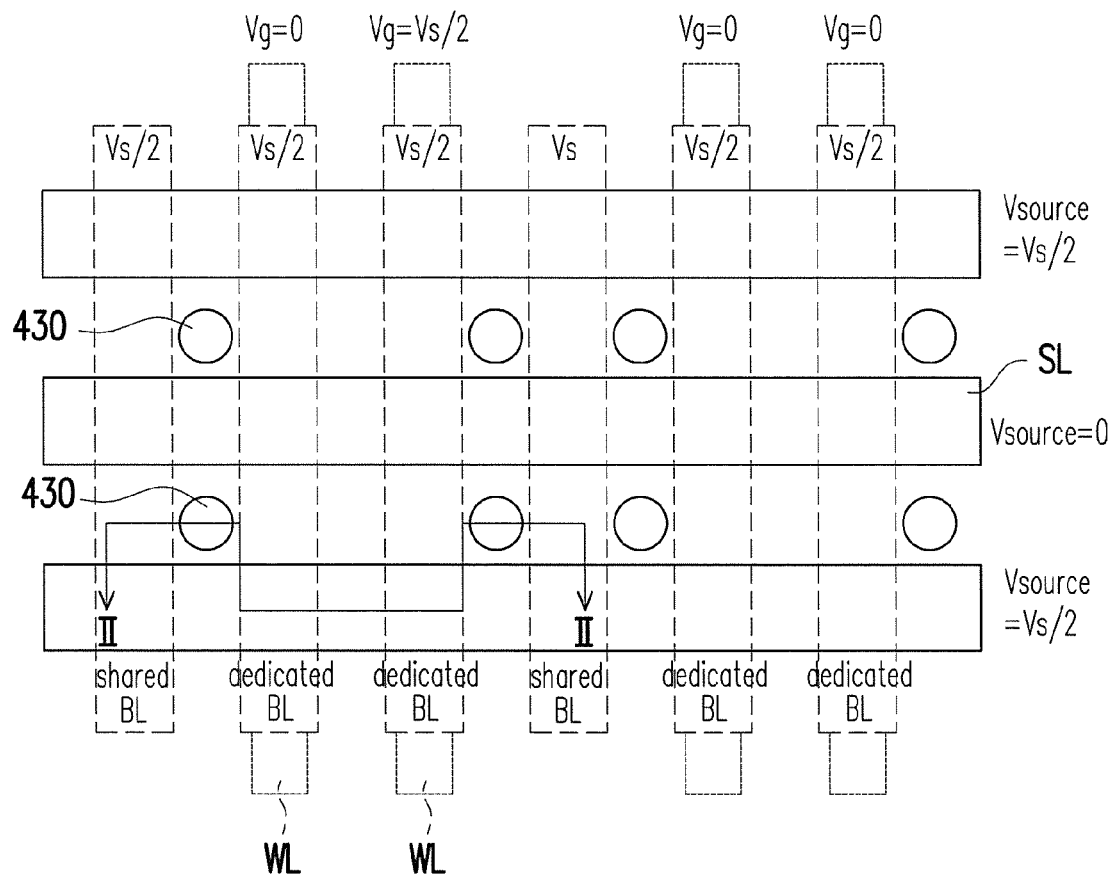
FIG. 13 is a schematic top view illustrating a three-dimensional resistance memory according to another exemplary embodiment.
Figure 14:
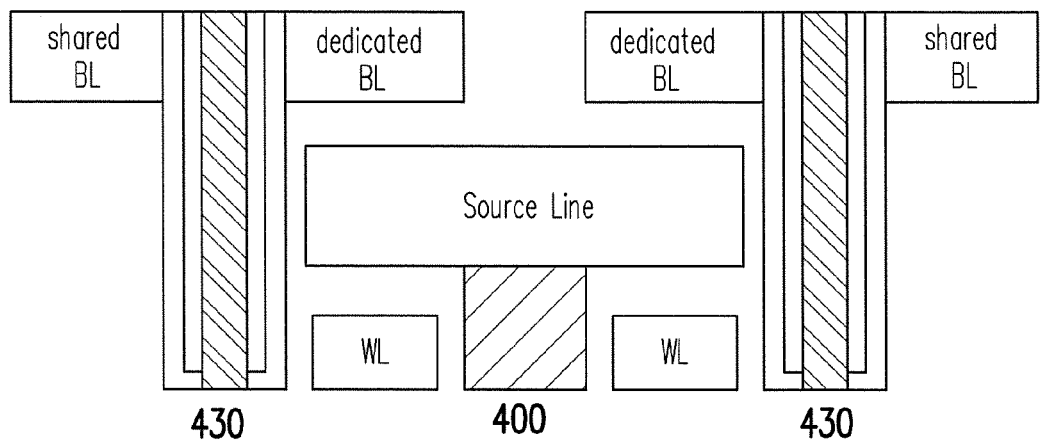
FIG. 14 is a schematic cross-sectional view taken along II-II line of FIG. 13.

FIG. 11 is a schematic top view illustrating a three-dimensional resistance memory according to an exemplary embodiment. FIG. 12 is a schematic cross-sectional view taken along I-I line of FIG. 11. FIG. 13 is a schematic top view illustrating a three-dimensional resistance memory according to another exemplary embodiment. FIG. 14 is a schematic cross-sectional view taken along II-II line of FIG. 13. Here, each of the via structures 330-1 and 430 have a structure and a function similar to those of the via structure 130 or 230, so the details are not iterated.

Even as a single-layer structure, the invention enables larger active switching areas within smaller cell footprint. Instead of a 100 nm×100 nm planar structure, one could have a 100 nm×400 nm sidewall switching area which gives the same lower forming voltage as a 200 nm×200 nm planar structure. This is shown in FIGS. 11 and 12, where the horizontal bit lines are spaced generally evenly, but every third one is shared between two memory bit locations. The via structures 330-1 are formed as vias with L-shaped spacer varying resistance material. The via structure 330-2 between the unshared bit lines (or dedicated bit lines) is used to connect to the source line and is not used for memory. Although the via structure 330-2 is not used for memory, the source line contact via (e.g. via structure 330-2) still has an L-shaped dielectric spacer to isolate the bit lines from this connection. Likewise, this L-shaped dielectric spacer is protected during etch by a metallic I-shaped spacer, and the remaining portion of the via is filled by the line contact metal. There are four sidewall bit locations inside a $12F^2$ repeated unit, where F the feature half-pitch. This leads to an effective bit size of $3F^2$. Forming more bit lines vertically above can reduce the bit size to $3F^2/N$, where N is the number of bit line layers formed vertically.

An alternative $3F^2$ embodiment is shown in FIGS. 13 and 14, where, viewed from above, the source line is laterally offset from the row of via structures 430 containing the memory material. This does not requiring extra processing for the source line contact via 400.

Figure 15:
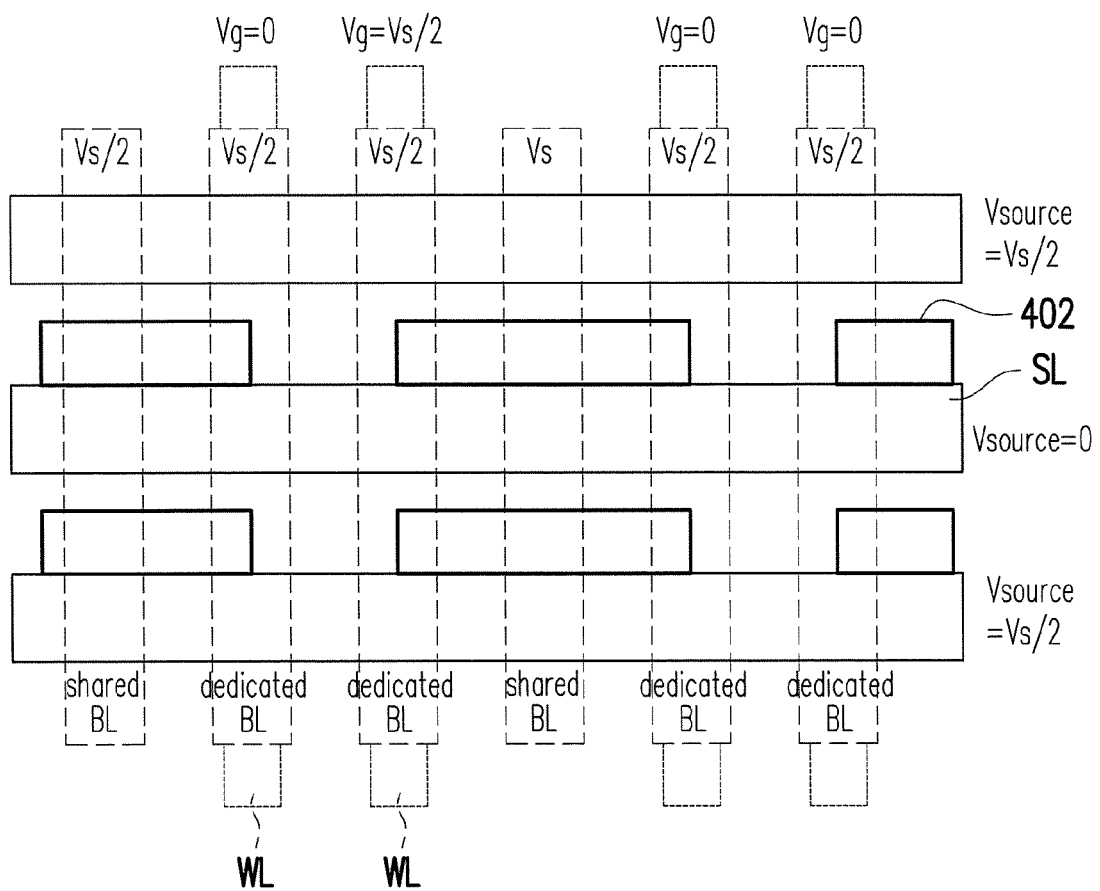
FIG. 15 shows a self-aligned via patterning scheme according to an exemplary embodiment.

Due to the likely lithographic difficulty of fabricating the via structures 430, FIG. 15 shows a self-aligned via patterning scheme, where the bit lines are covered by a hard mask 402 and the openings in the etch mask are wider than the actual via widths, allowing more tolerance in the patterning. The actual via openings are determined by the part of the etch mask openings not encountering the hard mask.

The enhanced bit density of the $3F^2$ structure requires management of current split between bits connected to the same transistor. In the simplest case, the L-shaped variable resistance spacer (e.g., HfOx) is covered by another L-shaped spacer (e.g., TaOx), acting as a resistive current-limiting layer. Alternatively, the two bits connected to the same transistor may be treated as a composite bit, with the two bits' individually measured resistances being processed (e.g., sqrt $(R_1R_2)$) to calculate an equivalent resistance that is less sensitive to natural, intrinsic random fluctuations of the individual bit resistances.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A three-dimensional resistance memory, comprising:
   a stack of layers, containing at least one conductive layer and at least one insulation layer, encapsulated in a dielectric layer and adjacent to at least one opening in the dielectric layer, wherein the opening penetrating through the stack of layers;
   at least one L-shaped variable resistance spacer, disposed on at least a portion of a sidewall of the opening adjacent to the stack of layers; and
   a first electrode layer, filling a remaining portion of the opening.

2. The three-dimensional resistance memory of claim 1, wherein the variable resistance spacer comprises HfOx, TaOx, AlOx, TiOx, NbOx, LaOx, ZrOx, doped versions thereof, or a combination thereof, and x is greater than zero.

3. The three-dimensional resistance memory of claim 1, further comprising an I-shaped protection spacer disposed between the at least one L-shaped variable resistance spacer and the first electrode layer.

4. The three-dimensional resistance memory of claim 3, wherein the I-shaped protection spacer comprises Ta, Ti, TaN or TiN.

5. The three-dimensional resistance memory of claim 1, wherein the stack of layers comprises a plurality of insulation layers and a plurality of conductive layers arranged alternately.

6. The three-dimensional resistance memory of claim 1, wherein each conductive layer comprises W, TiN, Al, Ta, Cu, Ti or a combination thereof.

7. The three-dimensional resistance memory of claim 1, wherein each conductive layer is a sandwich structure comprising a bottom barrier layer, a top barrier layer and a metal layer between the bottom barrier layer and the top barrier layer.

8. The three-dimensional resistance memory of claim 7, further comprising a metal oxide layer disposed between the metal layer and the L-shaped variable resistance spacer.

9. The three-dimensional resistance memory of claim 1, wherein the dielectric layer is in contact with the at least one L-shaped variable resistance spacer.

10. The three-dimensional resistance memory of claim 1, wherein the stack of layers is disposed on a material layer, and an included angle between the material layer and one sidewall of the opening is equal to or more than about 90 degrees and equal to or less than about 110 degrees.

11. The three-dimensional resistance memory of claim 10, wherein the material layer has a conductive plug therein, and the first electrode layer is electrically connected to the conductive plug.

12. A method of forming a three-dimensional resistance memory, comprising:
   providing a stack of layers encapsulated in a dielectric layer and adjacent to at least one opening through the dielectric layer, wherein the opening penetrating through the stack of layers;
   forming at least one L-shaped variable resistance spacer on at least a portion of a sidewall of the opening adjacent to the stack of layers; and filling a remaining portion of the opening with a first electrode layer.

13. The method of claim 12, wherein the variable resistance spacer comprises HfOx, TaOx, AlOx, TiOx, NbOx, LaOx, ZrOx, doped versions thereof, or a combination thereof, and x is greater than zero.

14. The method of claim 12, wherein an I-shaped protection spacer is further formed between the at least one L-shaped variable resistance spacer and the first electrode layer during the step of forming the at least one L-shaped variable resistance spacer.

15. The method of claim 14, wherein the I-shaped protection spacer comprises Ta, Ti, TaN or TiN.

16. The method of claim 12, wherein the step of providing the stack of layers comprises:
   forming a plurality of insulation layers and a plurality of conductive layers arranged alternately on a material layer; and
   patterning the insulation layers and the conductive layers to form at least two stacked structures with the opening therebetween.

17. The method of claim 16, wherein each conductive layer comprises W, TiN, Al, Ta, Cu, Ti or a combination thereof.

18. The method of claim 16, wherein each conductive layer is a sandwich structure comprising a bottom barrier layer, a top barrier layer and a metal layer between the bottom barrier layer and the top barrier layer.

19. The method of claim 12, wherein the dielectric layer is in contact with the at least one L-shaped variable resistance spacer.

20. The method of claim 12, wherein the stack of layers is disposed on a material layer, and an included angle between the material layer and one sidewall of the opening is equal to or more than about 90 degrees and equal to or less than about 110 degrees.

21. A via structure, formed adjacent to a stack comprising at least one horizontal metal layer and at least one insulation layer, comprising at least one L-shaped oxide spacer covering a sidewall of an opening, a non L-shaped metallic spacer covering the L-shaped oxide spacer, and a conductive layer filling a remaining volume of the opening,
   wherein the opening penetrating through the stack comprising the at least one horizontal metal layer and the at least one insulation layer.

22. The via structure of claim 21, wherein the via structure lands on a tungsten contact.

23. The via structure of claim 22, wherein the tungsten contact is connected to a diffusion region of a transistor.

24. The via structure of claim 21, wherein the L-shaped oxide spacer comprises a first L-shaped oxide spacer disposed on the sidewall of the opening and a second L-shaped oxide layer disposed on the first L-shaped oxide spacer.

25. The via structure of claim 24, wherein the first L-shaped oxide spacer comprises $HfO_2$, HfOx, or doped HfOx the second L-shaped spacer comprises TaOx, and x is greater than zero.

26. The via structure of claim 21, wherein the non L-shaped metallic spacer comprises Ta, Ti, TiN or TaN.

27. The via structure of claim 21, wherein the conductive layer comprises TiN.

28. The via structure of claim 21, wherein the L-shaped oxide spacer covers an entire sidewall of the opening.

29. The via structure of claim 21, wherein the L-shaped oxide spacer covers a portion of the sidewall of the opening.

30. A memory array structure having the via structure of claim 21, wherein there are two horizontal metal lines contacting the via structure at its sidewall, and the horizontal metal lines are in the same plane.

31. A memory array structure having the via structure of claim 21, wherein there are at least two horizontal metal lines contacting the via structure at its sidewall, and the horizontal metal lines are stacked vertically and separated by one dielectric layer.

32. The memory array structure of claim 31, wherein each of the horizontal metal lines comprises Al, W, or TiN.

33. The memory array structure of claim 31, wherein each of the horizontal metal lines comprises laterally separated TiN and Cu.

34. The memory array structure of claim 31, wherein the two horizontal metal lines are connected to Cu strap lines above an upmost horizontal metal line.

35. The memory array structure of claim 34, wherein a width of an upper horizontal metal line is narrower than a width of a lower horizontal metal line.

36. The memory array structure of claim 34, wherein an upper horizontal metal line is connected to a deeper metallic plug.

37. The memory array structure of claim 36, wherein a landing area for the deeper metallic plug is more extended than a landing area for a shallower metallic plug.

* * * * *